(12) United States Patent
Wang et al.

(10) Patent No.: US 8,782,475 B2
(45) Date of Patent: Jul. 15, 2014

(54) PRBS TEST MEMORY INTERFACE CONSIDERING DDR BURST OPERATION

(71) Applicant: Futurewei Technologies, Inc., Plano, TX (US)

(72) Inventors: Zhiyuan Wang, Fremont, CA (US); Pu Wang, Beijing (CN); Qi Wu, Beijing (CN); Yufang Sun, Beijing (CN); Lisheng Wang, Beijing (CN); Qixin Li, Xuanwu District (CN)

(73) Assignee: Futurewei Technologies, Inc., Plano, TX (US)

( * ) Notice: Subject to any disclaimer, the term of this patent is extended or adjusted under 35 U.S.C. 154(b) by 83 days.

(21) Appl. No.: 13/730,284

(22) Filed: Dec. 28, 2012

(65) Prior Publication Data

US 2014/0122955 A1 May 1, 2014

Related U.S. Application Data

(60) Provisional application No. 61/721,377, filed on Nov. 1, 2012.

(51) Int. Cl.
*G01R 31/28* (2006.01)
*G01R 31/3183* (2006.01)

(52) U.S. Cl.
CPC ............... *G01R 31/318385* (2013.01)
USPC ........................................... 714/715; 714/717

(58) Field of Classification Search
CPC ............... G01R 31/318385; G01R 31/318513; G01R 31/318572; G01R 31/318575
USPC .................................................. 714/715, 717
See application file for complete search history.

(56) References Cited

U.S. PATENT DOCUMENTS

| | | | | |
|---|---|---|---|---|
| 5,757,820 A | * | 5/1998 | Angelotti | 714/738 |
| 6,493,647 B1 | * | 12/2002 | Chiang et al. | 702/117 |
| 6,996,758 B1 | * | 2/2006 | Herron et al. | 714/726 |
| 7,096,393 B2 | * | 8/2006 | Caty et al. | 714/718 |
| 7,508,724 B2 | * | 3/2009 | Pyeon | 365/201 |
| 7,805,647 B2 | * | 9/2010 | McGarry | 714/724 |
| 7,979,756 B2 | * | 7/2011 | Dickens et al. | 714/715 |
| 2009/0161458 A1 | * | 6/2009 | Pyeon | 365/200 |
| 2010/0138729 A1 | | 6/2010 | Chen et al. | |
| 2014/0122955 | * | 5/2014 | Wang et al. | 714/738 |

* cited by examiner

*Primary Examiner* — David Ton
(74) *Attorney, Agent, or Firm* — Conley Rose, P.C.; Grant Rodolph; Nicholas K. Beaulieu

(57) ABSTRACT

A method of testing an interconnect between an electronic component and an external memory comprises receiving a data word having data bits and translating the data word into multiple cycles. The multiple cycles are transmitted through the interconnect to the external memory one after another such that a value of the data bit being transmitted is switched for each cycle. In another embodiment, an electronic component comprises an interface, a translation unit, and a test module. The translation module is configured to receive a burst from the external memory through the interface and is configured to translate the burst into a data word. The test module is configured to receive the data word from the translation module and is configured to compare the data word to a test pattern to detect an interconnect defect.

20 Claims, 10 Drawing Sheets

PRBS TEST MEMORY INTERFACE CONSIDERING DDR BURST OPERATION

CROSS-REFERENCE TO RELATED APPLICATION

The present application claims priority to U.S. Provisional Patent Application No. 61/721,377 filed Nov. 1, 2012 by Zhiyuan Wang et al. and entitled "PRBS Memory Interface Considering DDR Burst Operation," which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Electronic components (e.g., application specific integrated circuits, field-programmable gate arrays, etc.) are commonly connected to an external memory through an interface. The interface between an electronic component and an external memory may have a number of interconnects (e.g., pins) that are used to transfer data. For example, a 16-bit interface may have 16 interconnects between the electronic component and the external memory. The 16 interconnects allow 16 bits of data to be transferred in parallel. When more than 16 bits need to be transferred, the data can be grouped into a number of cycles that are transferred sequentially. For instance, if 256 bits of data needs to be transferred, the 256 bits can be grouped into 16 cycles with each cycle including 16 bits of data. The 16 bits of data within one cycle are transferred across the interconnects in parallel, and the 16 cycles are transferred across the interconnects one after the other.

In some systems, data is transferred in a series of burst operations. A burst operation includes transferring data in groups of cycles called bursts. For instance, in the 256 bit example discussed above, each burst may include 8 cycles. Accordingly, the 256 bits are transferred in two bursts. Each of the two bursts includes 8 cycles, and each cycle includes 16 bits. Additionally, a burst operation may incorporate double data rate (DDR) transfer. In DDR transfer, two cycles are transferred for each cycle of the system clock. Therefore, in the 8 cycle burst example, 2 cycles are sent for each cycle of the system clock, and the 8 cycle burst is transferred during 4 cycles of the system clock. Of course, cycles can include any number of bits, bursts can include any number of cycles, and any number of cycles can be transferred during a cycle of the system clock. The examples discussed above are given merely for illustration purposes.

Occasionally, a defect may exist on one or more of the interconnects that prevents data from being properly transferred between the electronic component and the external memory. Some examples of malfunctions that may occur include intersymbol interference and system switching noise (e.g., simultaneous switching input noise and simultaneous switching output noise). In intersymbol interference (ISI), a signal on one interconnect is distorted by previous or subsequent signals sent on the same interconnect. In system switching noise (SSN), a signal on one interconnect is distorted by signals sent on neighboring interconnects. Accordingly, defects on the interconnects between an electronic component and an external memory can cause data to be improperly transferred.

SUMMARY

In one embodiment, the disclosure includes a method of testing an interconnect between an electronic component and an external memory. A data word having data bits is received and is translated into multiple cycles. Each cycle identifies one of the data bits that is to be transmitted across the interconnect in the cycle. The multiple cycles are transmitted through the interconnect to the external memory one after another such that a value of the data bit being transmitted is switched for each cycle.

In another embodiment, the disclosure includes an electronic component that includes an interface, a translation unit, and a test module. The interface is configured to connect the electronic component to an external memory through a set of interconnects. The translation module is configured to receive a burst from the external memory through the interface and is configured to translate the burst into a data word. The test module is configured to receive the data word from the translation module and is configured to compare the data word to a test pattern to detect an interconnect defect.

In yet another embodiment, the disclosure includes an electronic device comprising a processor, an interface, and a test module. The processor is configured to generate a test pattern that is in a form of a data word and translate the test pattern into a burst that includes a number of cycles. The interface is configured to transmit the burst through interconnects such that a signal that each one of the interconnects receives is switched for each one of the cycles, and the test module is configured to compare data received through the interconnects to the test pattern and detect an interconnect defect based at least in part on the comparison.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents. While certain aspects of conventional technologies have been discussed to facilitate the present disclosure, applicants in no way disclaim these technical aspects, and it is contemplated that the present disclosure may encompass one or more of the conventional technical aspects discussed herein.

Disclosed herein are systems and methods that use pseudo-random bit sequences (PRBS) to test a memory interface in a DDR burst operation. In an embodiment, PRBS test patterns are generated that provide a high amount of stress on the interconnects between an electronic device and an external memory. For example, a PRBS test pattern may be generated that causes the signal on each interconnect to switch for each cycle of a burst. This can be useful to detect ISI defects and SSN defects by testing the interconnects with the fastest signal switching that the interconnects will be exposed to during operation. Additionally, embodiments of the present disclosure may reduce tests costs by being able to perform a self-check without any requirement for external equipment, shorten testing and debugging time by being able to perform a high speed test, and improve product quality by detecting defects at the manufacturing stage. Further features and benefits of embodiments are described below and shown in the accompanying figures.

Figure 1:
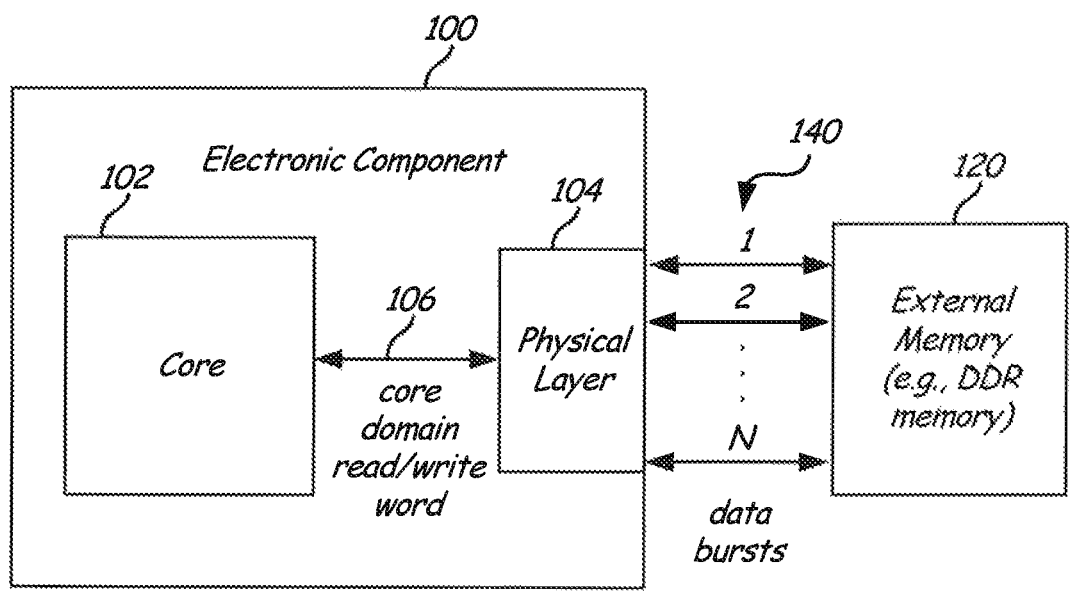
FIG. 1 is a schematic diagram of an embodiment of an electronic component connected to an external memory through interconnects.

FIG. 1 is a schematic diagram of an electronic component 100 connected to an external memory 120 through interconnects 140. Electronic component 100 can include any type of electronic component that may be connected to an external memory such as, but not limited to, an application specific integrated circuit (ASIC) and a field-programmable gate array (FPGA). Electronic component 100 includes a core 102 that processes data in the form of a core domain read/write word (e.g., a data word) that may include any number of bits (e.g., 128 bits, 256 bits, 512 bits, etc.).

External memory 120 can include any type of external memory such as, but not limited to, random access memories that use DDR technology (e.g., DDR, DDR2, DDR3, DDR4, etc. memories). In an embodiment, external memory 120 processes data in the form of bursts. Each burst includes a number of cycles, and each cycle includes a number of bits. The cycles are transferred to and from external memory 120 sequentially, and the bits within a cycle are transferred in parallel. The number of cycles in a burst may be referred to as the burst length, and the number of bits within a cycle may be referred to as the burst width. Embodiments may include bursts having any lengths and widths.

Electronic component 100 also includes a physical layer 104. Physical layer 104 is connected to core 102 through an electrical connection 106 (e.g., a bus, interconnect, pin, etc.) that is used to transfer data between physical layer 104 and core 102. Physical layer 104 is connected to external memory 120 through interconnects 140 (e.g., pins) that are used to transfer data between physical layer 104 and external memory 120. As shown in FIG. 1, interconnects 140 may include interconnects 1 through N, where N is any number.

Physical layer 104 enables data transfer between core 102 and external memory 120 by translating core domain read/write words to bursts and by translating bursts to core domain read/write words. For example, when core 102 is transferring data to external memory 120, core 102 transmits the data to physical layer 104 through electrical connection 106 in the form of a core domain read/write word. Physical layer 104 then translates the core domain read/write word into one or more bursts that can be transmitted to external memory 120 through interconnects 140. Also for example, when external memory 120 is transferring data to core 102, external memory 120 transmits the data to physical layer 104 through interconnects 140 in the form of a burst. Physical layer 104 then translates the burst into one or more core domain read/write words that can be transmitted to core 102 through electrical connection 106.

Figure 2:
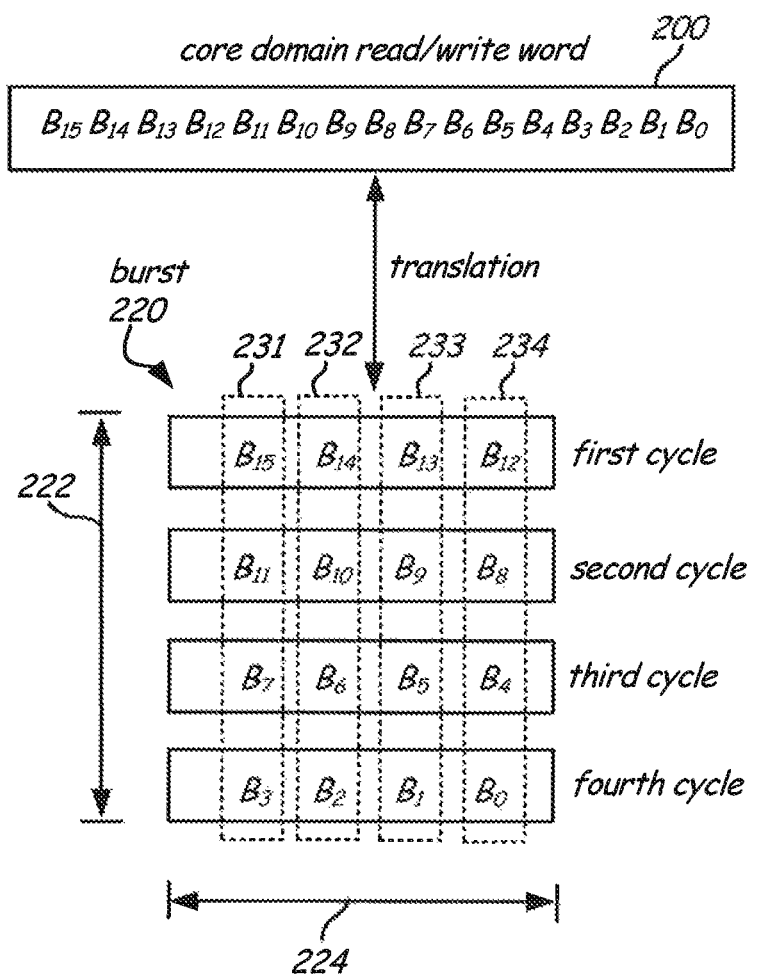
FIG. 2 is a schematic diagram of an embodiment of a mapping between bits in a core domain read/write word and bits in a burst.

FIG. 2 is a schematic diagram of a mapping between bits in a core domain read/write word 200 and bits in a burst 220. In the example shown in FIG. 2, core domain read/write word 200 is a 16 bit word that has the 16 bits $B_0$ through $B_{15}$. Burst 220 has a length 222 of 4 cycles and a width 224 of 4 bits. In other words, burst 220 is a 4 cycle burst with each cycle having 4 bits. In an embodiment, each burst column 231, 232, 233, and 234 corresponds to one interconnect. For instance, in FIG. 2, a first interconnect corresponds to column 231, a second interconnect corresponds to column 232, a third interconnect corresponds to column 233, and a fourth interconnect corresponds to column 234. Accordingly, when transferring the data in burst 220 to or from an external memory, the first interconnect corresponding to column 231 transfers the bit $B_{15}$ in the first cycle, the bit $B_{11}$ in the second cycle, the bit $B_7$ in the third cycle, and the bit $B_3$ in the fourth cycle. The second interconnect corresponding to column 232 transfers the bit $B_{14}$ in the first cycle, the bit $B_{10}$ in the second cycle, the bit $B_6$ in the third cycle, and the bit $B_2$ in the fourth cycle. The third interconnect corresponding to column 233 transfers the bit $B_{13}$ in the first cycle, the bit $B_9$ in the second cycle, the bit $B_5$ in the third cycle, and the bit $B_1$ in the fourth cycle. The fourth interconnect corresponding to column 234 transfers the bit $B_{12}$ in the first cycle, the bit $B_8$ in the second cycle, the bit $B_4$ in the third cycle, and the bit $B_0$ in the fourth cycle.

Figure 3:
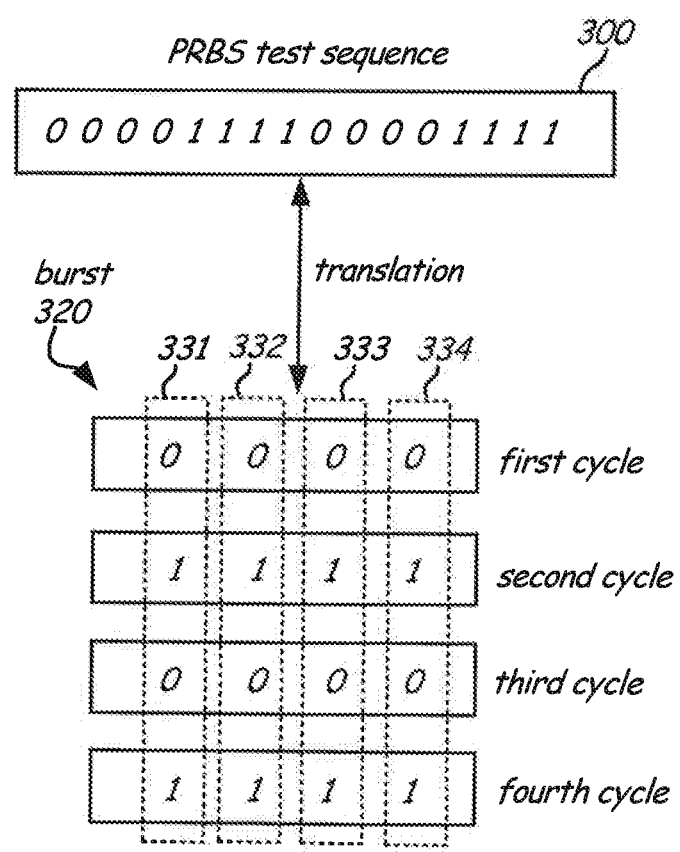
FIGS. 3 and 4 are schematic diagrams of embodiments of mappings between bits in pseudo-random bit stream test patterns and bursts.

FIG. 3 is a schematic diagram of a mapping between bits in an embodiment of a PRBS test pattern 300 and the corresponding burst 320. The example shown in FIG. 3 uses the configuration shown in FIG. 2 with a 16 bit core domain read/write word and a 4 cycle burst with each cycle including 4 bits. Columns 331, 332, 333, and 334 correspond to first, second, third, and fourth interconnects, respectively. It should be noted that this configuration is given merely for illustration purposes only. Embodiments of the present disclosure include core domain read/write words (e.g., PRBS test sequences) having any size, bursts having any number of cycles, and cycles having any number of bits.

PRBS test pattern 300 includes the bit pattern "0000 1111 0000 1111." When PRBS test pattern 300 is translated into burst 320, each bit in the first cycle has a value of 0, each bit in the second cycle has a value of 1, each bit in the third cycle has a value of 0, and each bit in the fourth cycle has a value of 1. In other words, each of the interconnects corresponding to columns 331, 332, 333, and 334 receives a bit value of 0 in the first cycle, a bit value of 1 in the second cycle, a bit value of 0 in the third cycle, and a bit value of 1 in the fourth cycle. Accordingly, the signal that each interconnect receives is switched at each cycle of the burst. This results in a high amount of stress for each interconnect, which can be useful in detecting defects (e.g., ISI and SSN defects) in the interconnects.

Figure 4:
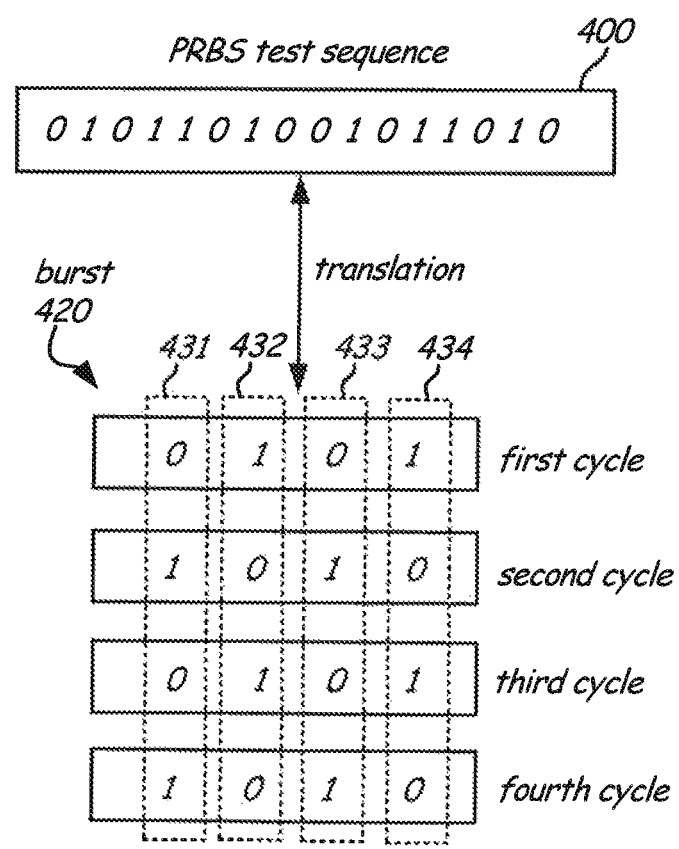

FIG. 4 is a schematic diagram of a mapping between bits in another embodiment of a PRBS test pattern 400 and the corresponding burst 420. The example shown in FIG. 4 also uses the configuration shown in FIG. 2 with a 16 bit core domain read/write word and a 4 cycle burst with each cycle including 4 bits. Columns 431, 432, 433, and 434 correspond to first, second, third, and fourth interconnects, respectively.

PRBS test pattern 400 includes the bit pattern "0101 1010 0101 1010." When PRBS test pattern 400 is translated into burst 420, each of the interconnects corresponding to columns 431 and 433 receives a bit value of 0 in the first cycle, a bit value of 1 in the second cycle, a bit value of 0 in the third cycle, and a bit value of 1 in the fourth cycle. Each of the interconnects corresponding to columns 432 and 434 receives a bit value of 1 in the first cycle, a bit value of 0 in the second cycle, a bit value of 1 in the third cycle, and a bit value of 0 in the fourth cycle. Accordingly, the signal that each interconnect receives is again switched at each cycle of the burst, which results in a high amount of stress for each interconnect.

Figure 5:
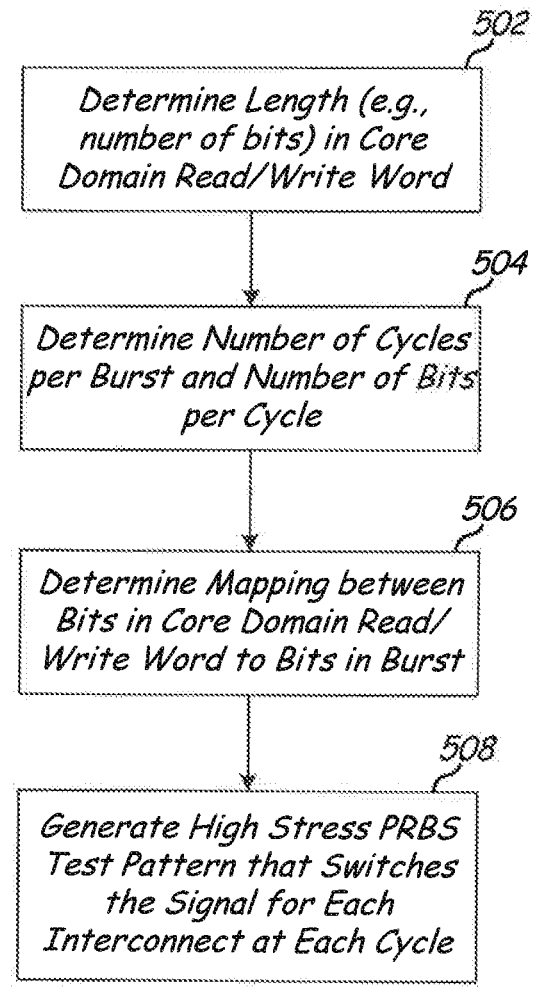
FIG. 5 is a flowchart of an embodiment of a method of generating a pseudo-random bit stream test pattern.

FIG. 5 is a flowchart of a method of generating a PRBS test pattern. At block 502, a length (e.g., a number of bits) of a core domain read/write word is determined, and at block 504, the number of cycles per a burst and the number of bits per a cycle are determined. The information from blocks 502 and 504 is then used at block 506 to determine a mapping between bits in the core domain read/write word to the bits in the burst. For instance, a mapping such as the one shown in FIG. 2 may be generated that maps each bit in the core domain read/write word 200 to a cycle and an interconnect in the burst 220. Again, the example in FIG. 2 is shown for illustration purposes only. Embodiments of the present disclosure are not limited to any particular configuration of core domain read/write word, burst, or mapping. Instead, embodiments can be adapted as needed such that they can be implemented in any system. Next, once the mapping is determined, a high stress PRBS test pattern is generated at block 508 that switches the signal for each interconnect at each cycle of the burst. For instance, a signal that each interconnect receives may be switched from a signal corresponding to a bit value of 0 to a bit value of 1 or from a signal corresponding to a bit value of 1 to a bit value of 0 at each cycle of the burst. Therefore, the signal that each interconnect receives is changed or alternated at each cycle of the burst. This provides the highest stress environment possible for the interconnect and accordingly provides the best opportunity for detecting a defect on the interconnect. However, in another embodiment, the signal that each interconnect does not necessarily need to be switched at each cycle of the burst. A relatively high stress pattern may still be possible if the signal is only switched for a portion of the cycles in a burst.

Figure 6:
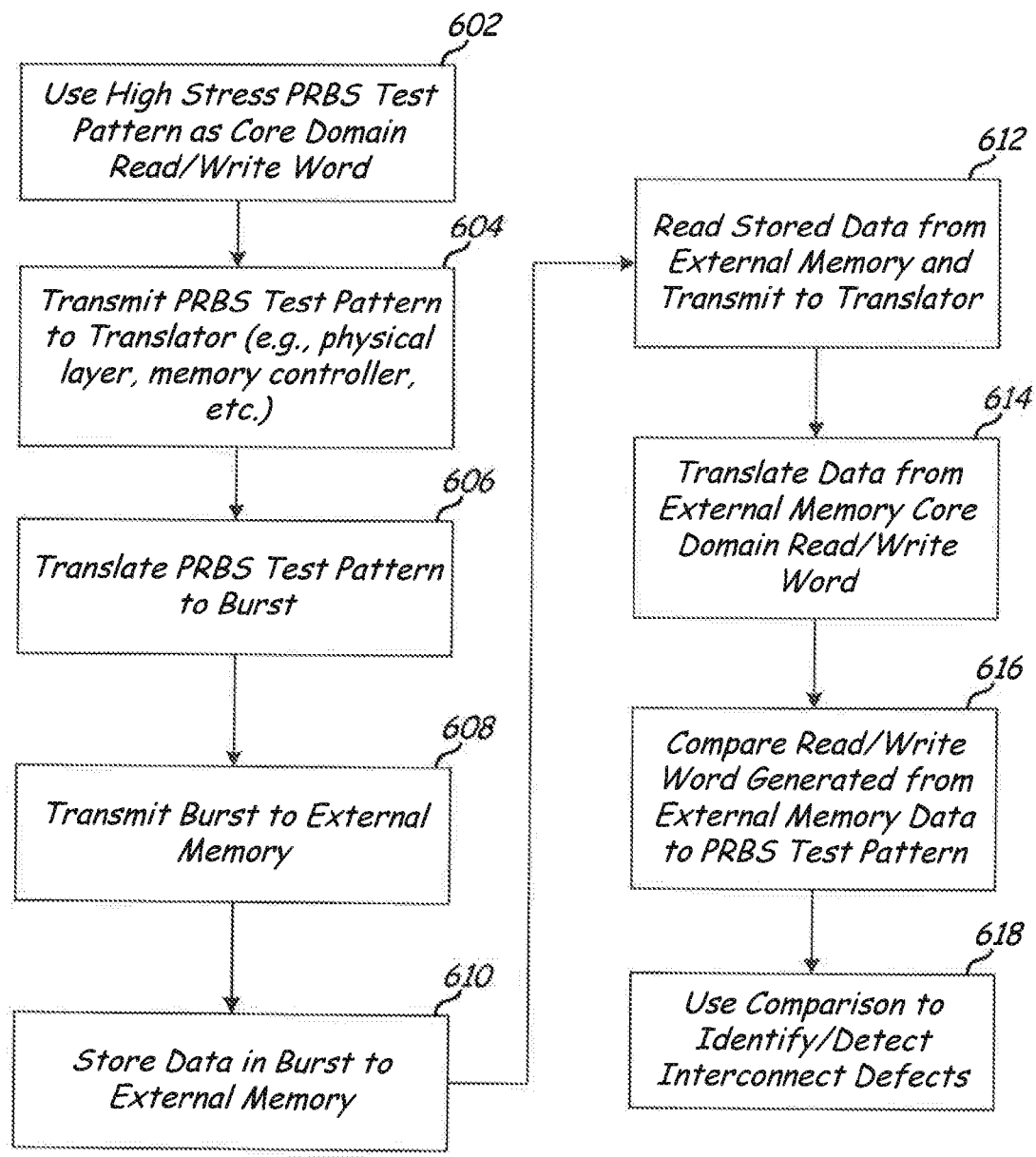
FIG. 6 is a flowchart of an embodiment of a method of using a pseudo-random hit stream test pattern to test an interconnect.

FIG. 6 is a flowchart of a method of using a PRBS test pattern. At block 602, a high stress PRBS test pattern (e.g., a PRBS test pattern generated using the method shown in FIG. 5) is used as a core domain read/write word. At block 604, the core domain read/write word is transmitted to a translator such as, but not limited to, a physical layer, a memory controller, etc. At block 606, the translator translates the core domain read/write word into a burst. At block 608, the burst is transmitted to an external memory, which may include transmitting the burst to the external memory in a DDR burst operation. At block 610, the data in the burst is stored to the external memory. At block 612, the stored data is read from the external memory and is transmitted to the translator. In an embodiment, the stored data is read back at block 612 from a same portion of the external memory where the data is stored at block 610. At block 614, the data from the external memory is translated into a core domain read/write word. At block 616, the core domain read/write word generated at block 614 is compared to the PRBS test pattern. Then, at block 618, the comparison at block 616 is used to identify interconnect defects. For instance, if there are any differences detected in the comparison, this may indicate that an interconnect defect exists.

In one embodiment, the high stress PRBS test pattern used at block 602 includes a test pattern that switches the signal that each interconnect receives at each cycle of a burst or at least for a portion of the cycles of a burst. However, embodiments of the present disclosure are not necessarily limited to any particular type of PRBS test pattern. In another embodiment, any test pattern can be used to detect a defect on an interconnect. For example, as long as it is known how the test pattern at block 602 is generated, the data read from the external memory at block 612 can be compared to the test pattern at block 602. If there are any differences detected between the two sets of data, this may indicate that a defect exists on the interconnect. However, if there are no differences detected between the two sets of data, this would indicate that no defect exists on the interconnect.

It should be noted that the method of using a PRBS test pattern illustrated in FIG. 6 can be implemented at the highest operating speed (e.g., a DDR burst operation) without the need for any external equipment. Therefore, embodiments of the present disclosure may reduce tests costs by being able to perform a self-check without any requirement for external equipment, and embodiments may shorten testing and debugging time by being able to perform a high speed test. Additionally, embodiments may be used at the manufacturing stage, which can reduce costs and improve quality by detecting defects at the manufacturing stage instead of at a later stage such as at a system level test.

Figure 7:
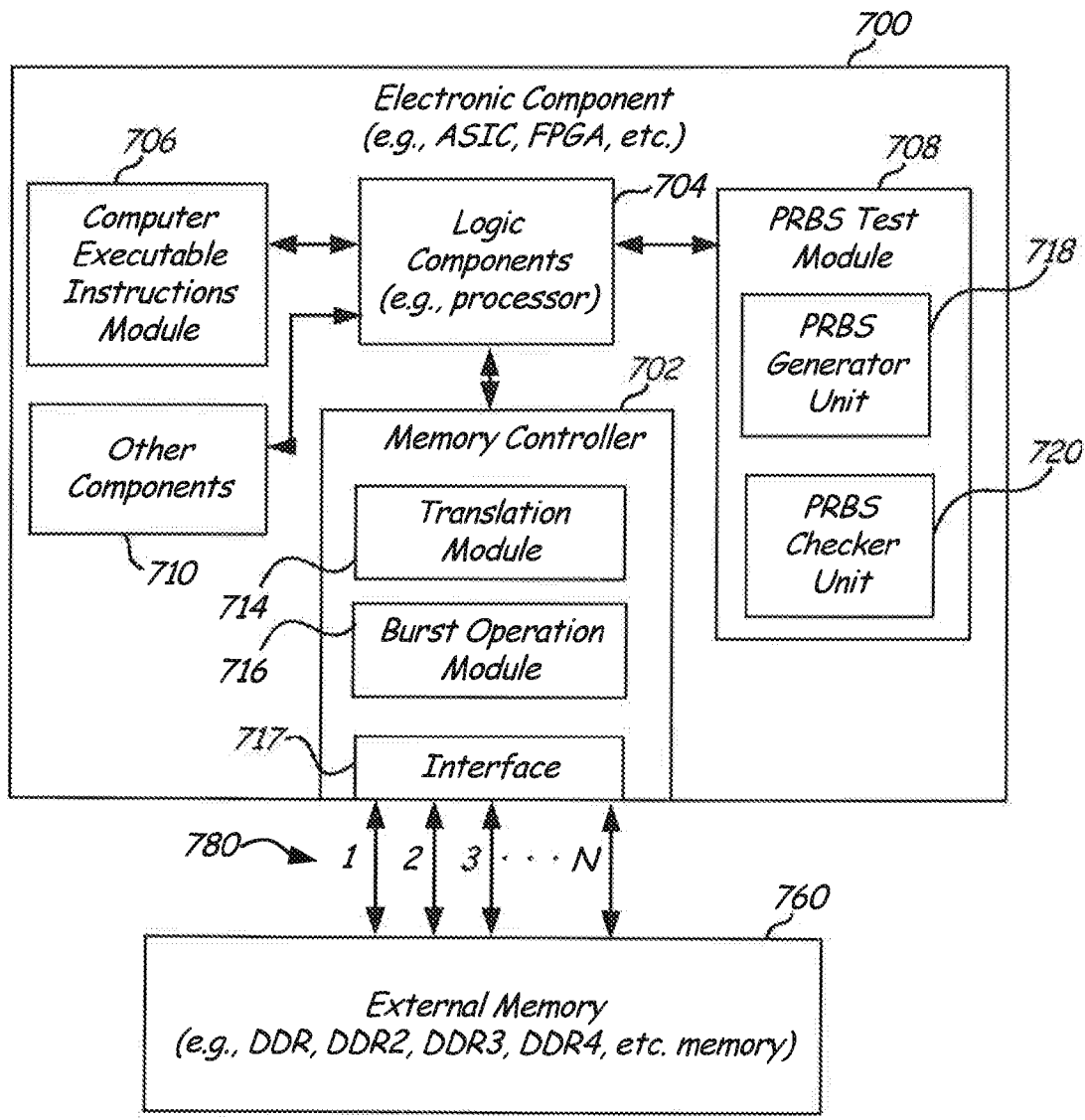
FIG. 7 is a schematic diagram of an embodiment of an electronic component with a pseudo-random bit stream test module that is connected to an external memory through interconnects.

FIG. 7 is a schematic diagram on another embodiment of an electronic component 700 connected to an external memory 760 through a set of interconnects (e.g., a set of pins) 780. Electronic component 700 can be used to implement one or more embodiments of the components and methods disclosed herein. Embodiments are not however limited to any specific implementation and can be used in electronic components differing from the specific example shown in FIG. 7.

Electronic component 700 can include any type of electronic component that may be connected to an external memory such as, but not limited to, an ASIC and a FPGA. Electronic component 700 includes a memory controller 702, logic components 704, a computer executable instructions module 706, a PRBS test module 708, and other components 710.

Memory controller 702 optionally includes a translation module 714, a burst operation module 716, and an interface 717. Translation module 714 enables memory controller 702 to translate data between a core domain read/write word form and a burst form. Burst operation module 716 enables memory controller 702 to send data to and receive data from external memory 760 in burst operations (e.g., in a DDR burst operation), and interface 717 connects electronic component 700 to interconnects 780 and enables memory controller 702 to be able to transmit electrical signals (e.g. signals corresponding to bursts) to external memory 760.

Logic components 704 perform logic and other processing functions required by electronic component 700, and computer executable instructions 706 include instructions for performing electronic component 700's operations. Additionally, it should be noted that logic components 704, computer executable instructions 706, and the other modules of electronic component 700 may transfer and process data in the form of core domain read/write words.

PRBS test module 708 includes a PRBS generator unit 718 and a PRBS checker unit 720. PRBS generator unit 718 is used to generate a PRBS test sequence. For example, PRBS generator unit 718 can be used to generate a PRBS test sequence using the method shown in FIG. 5. In one particular embodiment, for illustration purposes only and not by limitation, PRBS generator unit 718 can be used to automatically perform one or more of the functions indicated by blocks 502, 504, 506, and 508 in FIG. 5. However in another embodiment, PRBS generator unit 718 can be used by an operator to input a user programmed PRBS test sequence. Additionally, PRBS generator unit 718 may be configured to generate a PRBS test sequence as needed (e.g., "on the fly"). For instance, PRBS generator unit 718 may have a linear feedback shift register (LFSR) that is able to generate a PRBS test sequence when a PRBS test sequence is needed. Accordingly, PRBS test sequences do not need to be stored by any memory component. However, in another embodiment, a PRBS test sequence could be stored to a memory and retrieved as needed.

PRBS checker unit 720 is used to compare a PRBS test sequence sent to external memory 760 to a PRBS test sequence read back from external memory 760. For instance, PRBS checker unit 720 can use the method shown in FIG. 6 (e.g., blocks 614, 616, and/or 618 in FIG. 6). PRBS checker unit 720 can also be used to identify interconnect defects based on the comparison. For example, PRBS checker unit 720 can be used to compare data from block 602 in FIG. 6 to data from block 614 in block 616 in FIG. 6. If there are any differences detected between the two sets of data, this may indicate that a defect exists on the interconnect. However, if there are no differences detected between the two sets of data, this would indicate that no defect exists on the interconnect.

Finally with respect to FIG. 7, electronic component 700 optionally includes other components 710. Other components 710 represent the fact that electronic component 700 can have any other desired components as needed to implement any functionality. The simplified electronic component 700 shown here is merely intended to illustrate some general components that may be included in an electronic component that implements the PRBS test sequence generation and DDR burst operation testing described in this disclosure. Embodiments are not however limited to any particular configuration and can be implemented in a wide range of settings.

Figure 8:
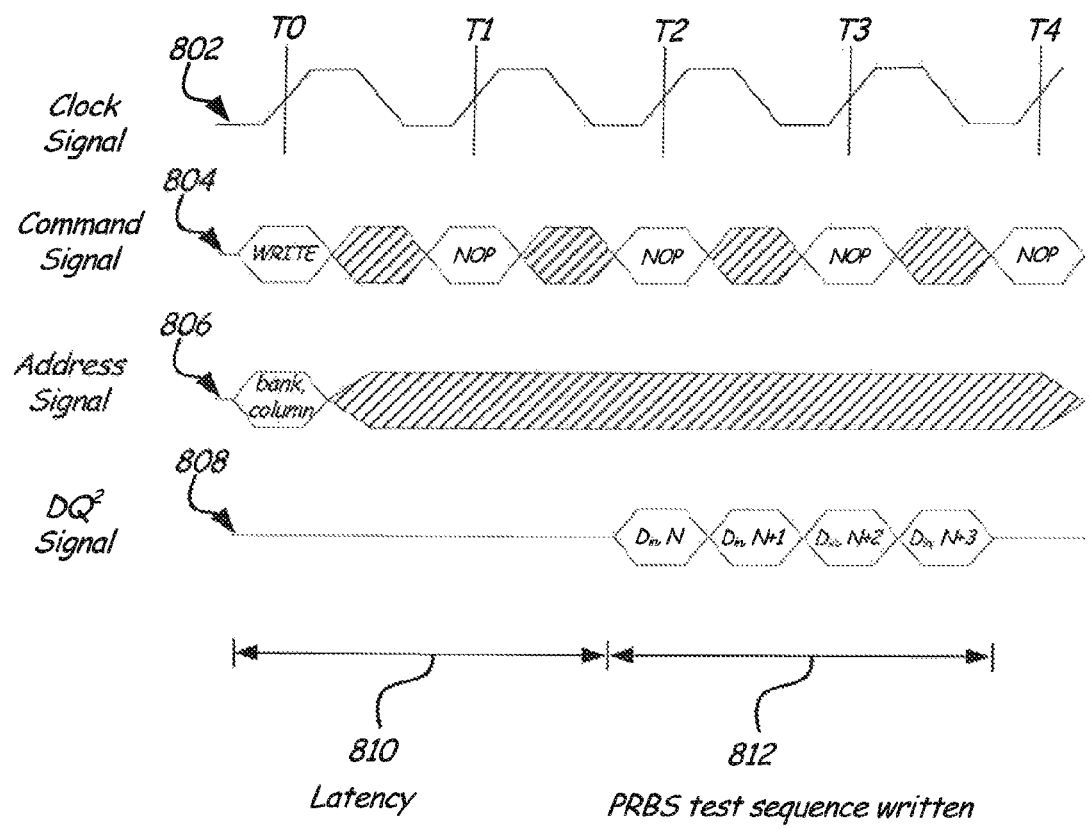
FIG. 8 is a schematic diagram of an embodiment of a double data rate burst write operation.

FIG. 8 is a schematic diagram of a DDR burst write operation. In particular, FIG. 8 shows signals used in a write operation that includes a 4 cycle burst. Embodiments of the present disclosure may utilize a DDR burst write operation such as the one shown in FIG. 8. However, embodiments are not limited to any particular DDR burst write operation and can differ from the specific example shown in FIG. 8. For example, embodiments can use DDR burst write operations with more or fewer than 4 cycles per a burst.

FIG. 8 includes a clock signal 802, a command signal 804, an address signal 806, and a $DQ^2$ signal 808. Clock signal 802 oscillates between a high state and a low state. As shown in FIG. 8, each full oscillation identifies a time period (e.g., time periods T0, T1, T2, T3, and T4 in FIG. 8). Command signal 804 identifies commands issued to an external memory. For instance, in FIG. 8, a write command (WRITE) is issued at time period T0. After time period T0, no operation commands (NOP) are issued indicating that no new operation is to be performed.

Address signal 806 identifies an address location of the external memory that the command corresponds to. For instance, the address signal 806 can specify a bank number and a column number for the portion of the external memory that is being written to.

$DQ^2$ signal 808 shows the signal of the data being written to the external memory. For instance, signal 808 shows that a 4 cycle burst is written to the external memory starting at time period T2 and ending at time period T4. As can be seen in FIG. 8, two cycles are written within one time period. This corresponds to the burst operation being a DDR burst operation in that 2 cycles are written for each cycle of the system clock (e.g., signal 802). In an embodiment, $DQ^2$ signal 808 corresponds to a high stress PRBS test sequence 812 that is written to the external memory. Additionally, it should be noted that signal 808 does not begin immediately after command signal 804 issues the write command. This represents system latency 810, which is commonly found in systems.

Figure 9:
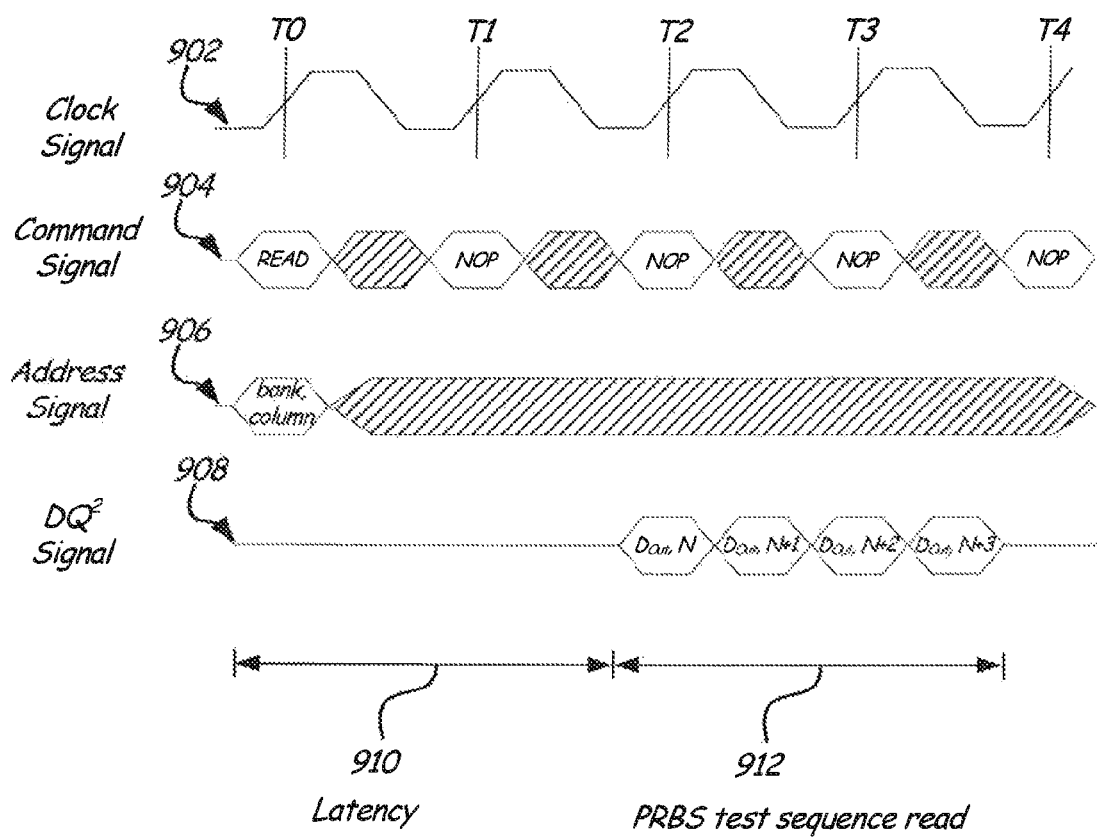
FIG. 9 is a schematic diagram of an embodiment of a double data rate burst read operation.

FIG. 9 is a schematic diagram of a DDR burst read operation. In particular, FIG. 9 shows signals used in a read operation that includes a 4 cycle burst. Embodiments of the present disclosure may utilize a DDR burst read operation such as the one shown in FIG. 9. However, embodiments are not limited to any particular DDR burst read operation and can differ from the specific example shown in FIG. 9. For example, embodiments can use DDR burst read operations with more or fewer than 4 cycles per a burst.

Similar to FIG. 8, FIG. 9 also includes a clock signal 902, a command signal 904, an address signal 906, and a $DQ^2$ signal 908. Clock signal 902 oscillates between a high state and a low state and identifies time periods (e.g., time periods T0, T1, T2, T3, and T4 in FIG. 9). Command signal 904 identities commands issued to an external memory. For instance, in FIG. 9, a read command (e.g., READ) is issued at time period T0. After time period T0, no operation commands (e.g., NOP) are issued indicating that no new operation is to be performed.

Address signal 906 identifies an address location of the external memory that the command corresponds to. For instance, the address signal 906 can specify a bank number and a column number for the portion of the external memory that is being read from.

$DQ^2$ signal 908 shows the signal of the data being read from the external memory. For instance, signal 908 shows that a 4 cycle burst is read from the external memory starting at time period T2 and ending at time period T4. As can be seen in FIG. 9, two cycles are read within one time period. This again corresponds to the burst operation being a DDR burst operation in that 2 cycles are read for each cycle of the system clock (e.g., signal 902). In an embodiment, signal 908 corresponds to a high stress PRBS test sequence 912 that is read from the external memory. Additionally, it should be noted that signal 908 does not begin immediately after command signal 904 issues the read command. This again represents system latency 910.

As described above and shown in the figures, embodiments include systems and methods that use PRBS to test a memory interface in a DDR burst operation. In an embodiment, PRBS test patterns are generated that provide a high amount of stress on the interconnects between an electronic device and an external memory. For example, a PRBS test pattern may be generated that causes the signal on each interconnect to switch for each cycle of a burst. This can be useful to detect ISI defects and SSN defects by testing the interconnects with the fastest signal switching that the interconnects will be exposed to during operation. Additionally, embodiments of the present disclosure may reduce tests costs by being able to perform a self-check without any requirement for external equipment, shorten testing and debugging time by being able to perform a high speed test, and improve product quality by detecting defects at the manufacturing stage.

Figure 10:
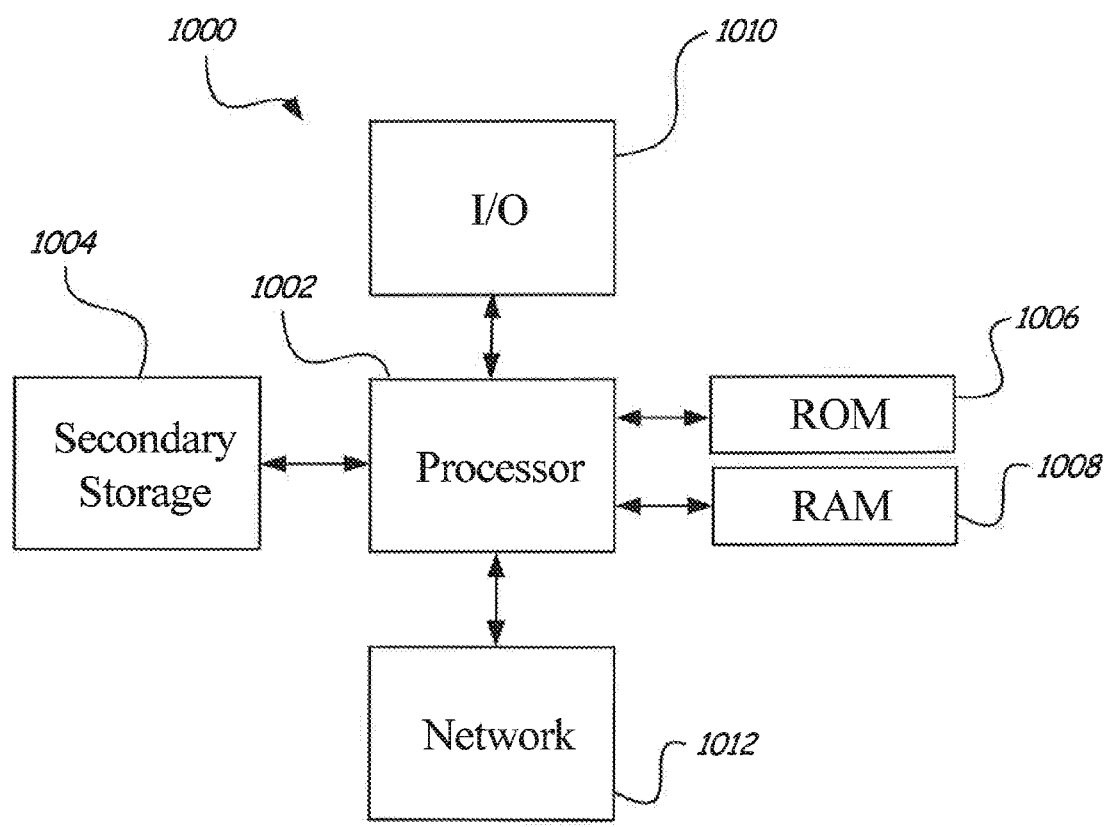
FIG. 10 is a schematic diagram of an embodiment of a general-purpose computer system.

The methods and components described above may be implemented on any general-purpose network component, such as a computer or network component with sufficient processing power, memory resources, and network throughput capability to handle the necessary workload placed upon it. FIG. 10 illustrates a schematic diagram of a general-purpose network component or computer system 1000 suitable for implementing one or more embodiments of the methods or components disclosed herein. The general-purpose network component or computer system 1000 includes a processor 1002 (which may be referred to as a central processor unit or CPU) that is in communication with memory devices including secondary storage 1004, read only memory (ROM) 1006, random access memory (RAM) 1008, input/output (I/O) devices 1010, and network connectivity devices 1012. Although illustrated as a single processor, the processor 1002 is not so limited and may comprise multiple processors. The processor 1002 may be implemented as one or more CPU chips, cores (e.g., a multi-core processor), FPGAs, ASICs, and/or digital signal processors (DSPs), and/or may be part of one or more ASICs. The processor 1002 may be configured to implement any of the schemes described herein. The processor 1002 may be implemented using hardware, software, or both.

The secondary storage 1004 is typically comprised of one or more disk drives or tape drives and is used for non-volatile storage of data and as an over-flow data storage device if the RAM 1008 is not large enough to hold all working data. The secondary storage 1004 may be used to store programs that are loaded into the RAM 1008 when such programs are selected for execution. The ROM 1006 is used to store instructions and perhaps data that are read during program execution. The ROM 1006 is a non-volatile memory device that typically has a small memory capacity relative to the larger memory capacity of the secondary storage 1004. The RAM 1008 is used to store volatile data and perhaps to store instructions. Access to both the ROM 1006 and the RAM 1008 is typically faster than to the secondary storage 1004.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, R1, and an upper limit, Ru, is disclosed, any number falling within the range is specifically disclosed. In particular, the following numbers within the range are specifically disclosed: $R=R1+k*(Ru-R1)$, wherein k is a variable ranging from 1 percent to 100 percent with a 1 percent increment, i.e., k is 1 percent, 2 percent, 3 percent, 4 percent, 5 percent, . . . , 70 percent, 71 percent, 72 percent, . . . , 95 percent, 96 percent, 97 percent, 98 percent, 99 percent, or 100 percent. Moreover, any numerical range defined by two R numbers as defined in the above is also specifically disclosed. The use of the term about means ±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method of testing an interconnect between an electronic component and an external memory comprising:
   receiving a data word having data bits;
   translating the data word into multiple cycles, wherein each cycle identifies one of the data bits that is to be transmitted across the interconnect in the cycle; and
   transmitting the multiple cycles through the interconnect to the external memory one after another, wherein a value of the data bit being transmitted is switched for each cycle.

2. The method of claim 1, wherein the multiple cycles are grouped into bursts, and wherein the bursts are transmitted through the interconnect in a burst mode operation.

3. The method of claim 2, wherein the burst mode operation comprises a double data rate (DDR) burst mode operation in which two of the multiple cycles are transmitted through the interconnect for each cycle of a system clock.

4. The method of claim 2, further comprising:
   generating a pseudo-random bit stream (PRBS) test pattern based at least in part on a mapping between the data word and the bursts;
   using the PRBS test pattern as the data word, and
   wherein transmitting the multiple cycles through the interconnect comprises storing the PRBS test pattern to a portion of the external memory.

5. The method of claim 4, further comprising:
receiving a set of data bits from the external memory through the interconnect, wherein the set of data bits are read from the same portion of the external memory; and
comparing the set of data bits to the PRBS test pattern.

6. The method of claim 5, further comprising:
identifying a difference between the set of data bits and the PRBS test pattern; and
detecting an interconnect defect based at least in part on the identified difference.

7. An electronic component comprising:
an interface that is configured to connect the electronic component to an external memory through a set of interconnects;
a translation module that is configured to receive a burst from the external memory through the interface and that is configured to translate the burst into a data word; and
a test module that is configured to receive the data word from the translation module and that is configured to compare the data word to a test pattern to detect an interconnect defect.

8. The electronic component of claim 7, further comprising a test pattern generator What is configured to generate the test pattern.

9. The electronic component of claim 8, wherein the test pattern generator unit is configured to generate the test pattern based at least in part on a mapping between the data word and the burst.

10. The electronic component of claim 7, further comprising a burst operation module that is configured to send data to and receive data from the external memory in double data rate (DDR) burst operations.

11. The electronic component of claim 7, wherein the translation module is configured to receive the test pattern and translate the test pattern into another burst, and wherein the interface is configured to transmit the another burst to the external memory through the set of interconnects.

12. The electronic component of claim 11, wherein the another burst includes cycles, and wherein the interface is configured to transmit the cycles through the set of interconnects.

13. The electronic component of claim 12, wherein the interface is configured to transmit the cycles such that a signal that each one of the interconnects receives is switched for each one of the cycles.

14. The electronic component of claim 7, wherein the test pattern comprises a pseudo-random bit stream test pattern.

15. An electronic device comprising:
a processor configured to generate a test pattern that is in a form of a data word and translate the test pattern into a burst that includes a number of cycles;
an interface configured to transmit the burst through interconnects such that a signal that each one of the interconnects receives is switched for each one of the cycles; and
a test module configured to compare data received through the interconnects to the test pattern and detect an interconnect defect based at least in part on the comparison.

16. The electronic device of claim 15, wherein the test pattern is generated based at least in part on a number of bits in the data word.

17. The electronic device of claim 15, wherein the test pattern is generated based at least in part on the number of cycles in the burst.

18. The electronic device of claim 15, wherein the test pattern is generated based at least in part on a number of bits transmitted in each one of the cycles.

19. The electronic device of claim 15, wherein the burst is transmitted through the interconnects using a burst mode operation.

20. The electronic device of claim 19, wherein the burst mode operation comprises a double data rate (DDR) burst mode operation.

* * * * *

UNITED STATES PATENT AND TRADEMARK OFFICE
CERTIFICATE OF CORRECTION

PATENT NO. : 8,782,475 B2
APPLICATION NO. : 13/730284
DATED : July 15, 2014
INVENTOR(S) : Zhiyuan Wang et al.

It is certified that error appears in the above-identified patent and that said Letters Patent is hereby corrected as shown below:

In the Claims

Column 11, Lines 22-24, Claim 8 should read:

The electronic component of claim 7, further comprising a test pattern generator unit that is configured to generate the test pattern.

Signed and Sealed this
Thirtieth Day of September, 2014

Michelle K. Lee
*Deputy Director of the United States Patent and Trademark Office*